US006900535B2

(12) United States Patent
Zhou

(10) Patent No.: US 6,900,535 B2
(45) Date of Patent: May 31, 2005

(54) BGA/LGA WITH BUILT IN HEAT SLUG/SPREADER

(75) Inventor: Tiao Zhou, Irving, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/137,605

(22) Filed: May 1, 2002

(65) Prior Publication Data

US 2003/0206401 A1 Nov. 6, 2003

(51) Int. Cl.$^7$ .......................... H01L 23/36; H01L 21/48; H05K 1/00
(52) U.S. Cl. .................. 257/707; 257/720; 438/106; 174/252
(58) Field of Search ................................ 257/678, 706, 257/707, 713, 720, 796; 438/106, 122, 127; 174/252, 260

(56) References Cited

U.S. PATENT DOCUMENTS 5,583,377 A * 12/1996 Higgins, III ................. 257/707
5,717,252 A *  2/1998 Nakashima et al. ........ 257/707
5,856,911 A *  1/1999 Riley .......................... 361/704

* cited by examiner

Primary Examiner—Evan Pert
(74) Attorney, Agent, or Firm—Lisa K. Jorgenson; William A. Munck

(57) ABSTRACT

A ball or land grid array plastic substrate portion is formed with a hole therethrough in the region on which the integrated circuit die is to be formed, with a copper heat slug inserted within the opening having a bottom surface substantially aligned with the bottom surface of the plastic portion to allow molding tooling for conventional ball or land grid array packages to be employed. The integrated circuit die is mounted on the heat slug, which has a solderable bottom surface and is directly soldered to the PCB. An additional copper heat spreader region is formed on an upper surface of the plastic portion.

20 Claims, 5 Drawing Sheets

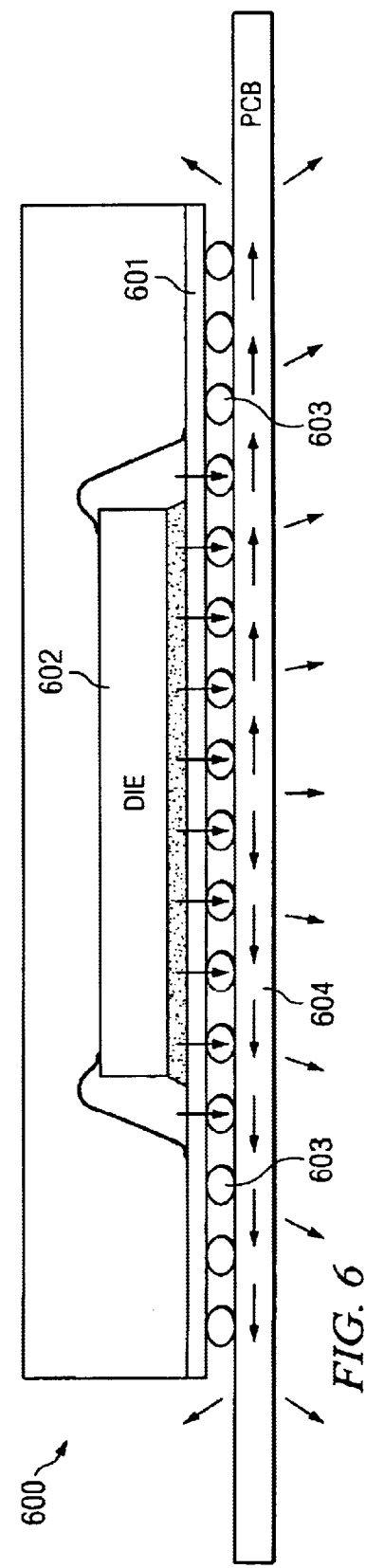
FIG. 5A
FIG. 5B
FIG. 5C
FIG. 5D
FIG. 5E
FIG. 5F
FIG. 6

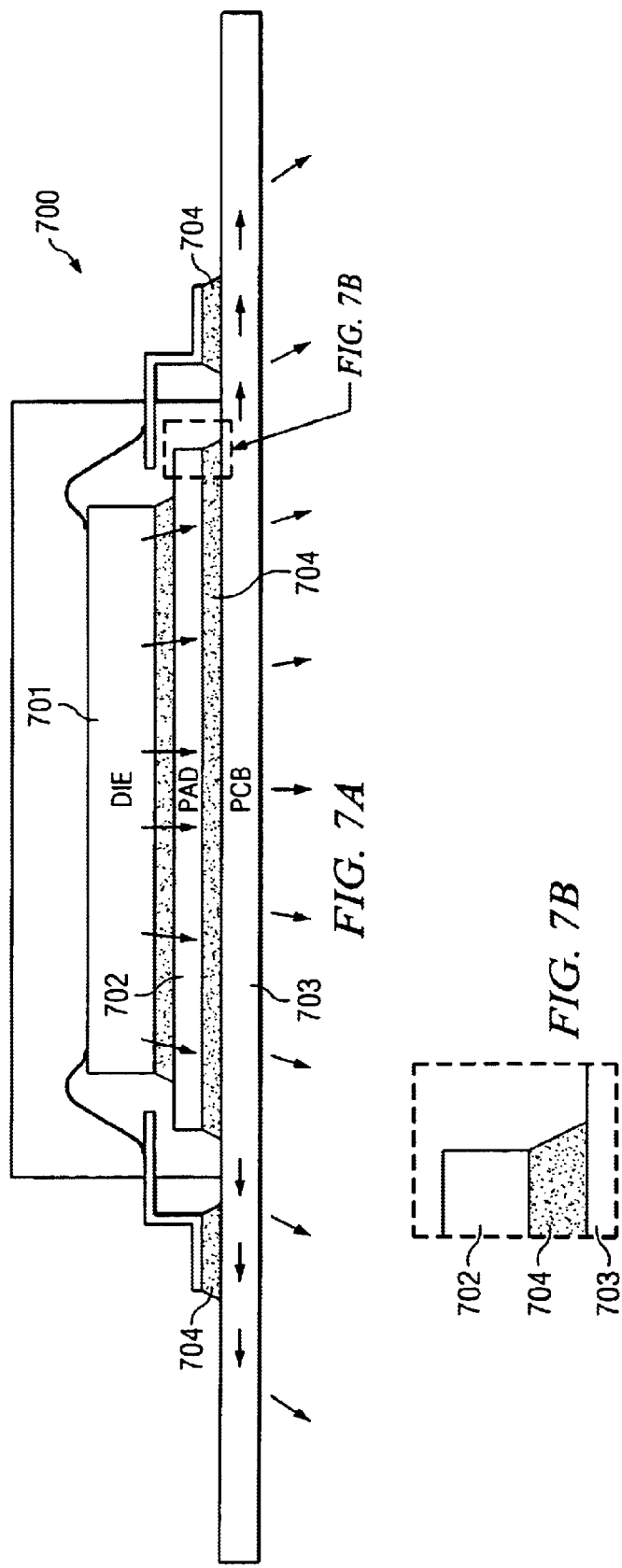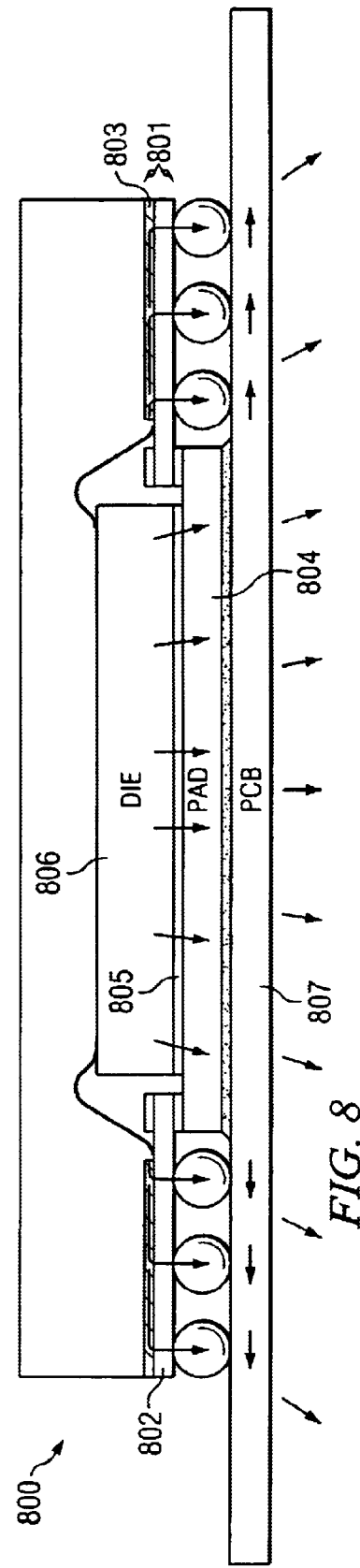

BGA/LGA WITH BUILT IN HEAT SLUG/ SPREADER

TECHNICAL FIELD OF THE INVENTION

The present invention is directed, in general, to integrated circuit packaging and, more specifically, to heat dissipation within ball grid array integrated circuit packages.

BACKGROUND OF THE INVENTION

The following description is provided solely as background and without admission of "prior art" status of any of the structures and processes disclosed therein within the legal meaning of that term.

Conventional ball grid array (BGA) packages 600 are based on a plastic packaging substrate 601 as illustrated in FIG. 6. Heat dissipation occurs mainly by conduction from the integrated circuit die 602 through the packaging substrate 601 and the solder balls 603 to the printed circuit board (PCB) 604. The plastic packaging substrate 601 has a very low thermal conductivity (0.2 Watts per meter per degree Celsius or W/m/° C.) and is therefore generally poor in both heat conduction and heat spreading (arrows indicate heat conduction).

BGA and equivalent land grid array (LGA) packages are often compared to thermally enhanced lead frame packages such as the exposed pad (epad) thin quad flat package (TQFP) 700 illustrated in FIGS. 7A and 7B, in which the integrated circuit die 701 is attached to the die pad (or paddle) 702, which is in turn directly soldered to the PCB 703 by solder regions 704. The heat conduction path includes the copper lead frame die pad 702, which has a high thermal conductivity such as copper (400 W/m/° C.) contributing to the low thermal resistance for the package. It would be desirable for a BGA/LGA package to have equivalent thermal performance to epad TQFP so that BGA/LGA packaging may be employed to accommodate the same electrical and thermal performance requirements.

To achieve such thermal enhancement, a copper heat slug/copper heat spreader BGA (C²BGA) package 800 has been proposed, as illustrated in FIG. 8. C²BGA package 800 employs a bi-layer substrate 801 including a non-conductive (e.g., plastic, fiberglass, or epoxy) portion 802 with an opening therethrough and covered by a copper heat spreading layer 803. A copper heat slug 804 having a bottom with a solderable finish is attached to the substrate 801 by an adhesive 805, preferably thermally conductive, such as an electrically conductive glue or solder. The integrated circuit die 806 is directly attached to the heat slug 804, which in turn is soldered to the PCB 807. Heat is dissipated outward toward the solder balls by the heat spreader layer 803 and directly conducted to the PCB 807 through the high thermal conductivity heat sink 804 and the solder balls.

C²BGA package 800 has a thermal performance equivalent to that of an epad TQFP package. However, since the C²BGA package 800 is not flat due to the attached slug, specialized wire bonding and molding tooling are required for packaging. In addition, there are challenges in the slug attachment to the substrate, including making a void free attachment with a consistent bond line and tight lateral (x-y) placement tolerance.

There is, therefore, a need in the art for an improved thermal performance ball grid array package that allows the same tooling to be employed for package assembly as conventional ball grid array packages, with consistent placement of the heat slug/spreader.

SUMMARY OF THE INVENTION

To address the above-discussed deficiencies of the prior art, it is a primary object of the present invention to provide, for use in an integrated circuit package, a ball or land grid array plastic substrate portion formed with a hole therethrough in the region on which the integrated circuit die is to be mounted, with a copper heat slug inserted within the opening having a bottom surface substantially aligned with the bottom surface of the plastic portion to allow molding tooling for conventional ball or land grid array packages to be employed. The integrated circuit die is mounted on the heat slug, which has a solderable bottom surface and is directly soldered to the PCB in some applications. An additional copper heat spreader region is formed on an upper surface of the plastic portion.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIGS. 5A through 5F illustrate stepwise formation of a substrate for a high thermal conductivity ball grid array or land grid array package compatible with conventional wire bonding and molding toolings for such packages according to the alternative embodiment of the present invention;

FIG. 6 depicts a conventional ball grid array package soldered on a printed circuit board;

FIGS. 7A and 7B depict an exposed pad thin quad flat package soldered on a printed circuit board; and FIG. 8 is a thermally enhanced ball grid array package.

DETAILED DESCRIPTION OF THE INVENTION

FIGS. 1 through 5F, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
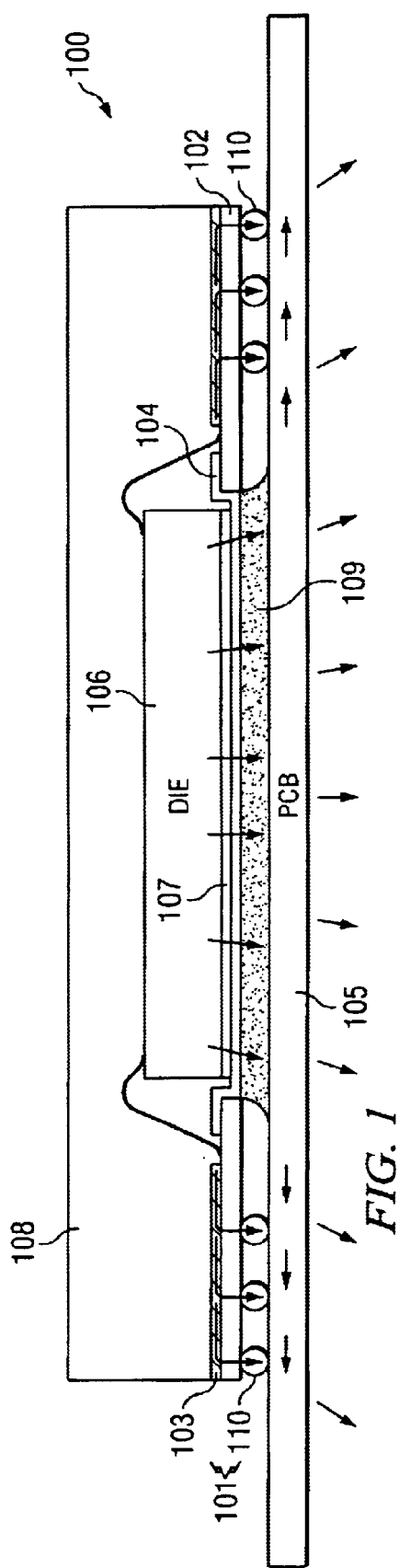
FIG. 1 depicts a high thermal conductivity ball grid array or land grid array package compatible with conventional wire bonding and molding toolings for such packages according to one embodiment of the present invention.

FIG. 1 depicts a high thermal conductivity ball grid array or land grid array package compatible with conventional package assembly tooling for such packages according to one embodiment of the present invention. The package 100 employed a dual-material substrate 101 including a plastic portion 102 having an opening or cavity therein and a high thermal conductivity metal (e.g., copper) plate 103 which serves as both a die pad and a heat spreader. Metal plate 103, which may be stamped, has a down set 104 at the location of the opening through the plastic portion 102 serving as a die pad/heat slug. Metal plate 103 is laminated to the plastic portion 102. The bottom surface of the down set die pad/heat slug portion 104 of metal plate 103, which has a solderable finish, is at the same level as the bottom of plastic portion 102 (on which solder balls or lands are formed) and is soldered directly to the PCB 105. The bottom surface of heat slug 104 may extend within the opening through the plastic substrate portion 102 or may project slightly out of that opening, provided the projection does not interfere with the use of conventional ball grid array or land grid array molding tools. In that regard, the bottom surface of the heat slug or heat spreader 104 on which the integrated circuit die is mounted is "substantially aligned" with the bottom surface of the plastic portion of the substrate if the difference (between the level of the bottom of the heat slug and the level of the bottom of the plastic portion) does not interfere with use of conventional package assembly tooling for packaging conventional ball or land grid array packages which do not include a heat slug or heat spreader below the integrated circuit die.

The integrated circuit die 106 is mounted on the down set die pad/heat sink 104 using, for example, an adhesive 107. Metal plate 103 includes slots exposing the bond fingers of conductive traces on plastic substrate (not shown in FIG. 1) for connection with bond wires from the integrated circuit die 106.

Figure 2A:
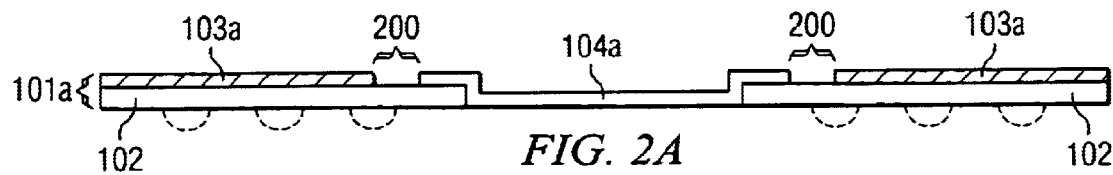
FIGS. 2A and 2B depict various views of a substrate for a high thermal conductivity ball grid array or land grid array package compatible with conventional wire bonding and molding toolings for such packages according to one embodiment of the present invention.
Figure 2B:
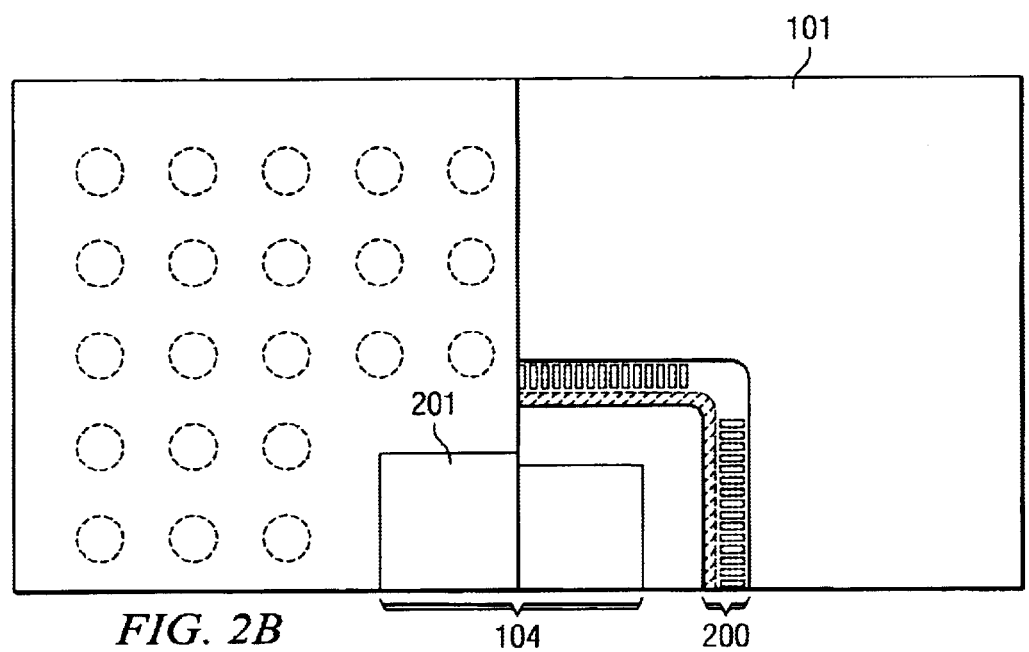

FIGS. 2A and 2B depict various views of a substrate for a high thermal conductivity ball grid array or land grid array package compatible with conventional molding tooling for such packages according to one embodiment of the present invention. One embodiment 101a of substrate 101 is shown in a side cross-sectional view in FIG. 2A, while FIG. 2B is a split partial plan view of the substrate 101, with a partial bottom view shown on the left side and a partial top view shown on the right side.

The plastic (e.g., epoxy, fiberglass, etc.) portion 102 includes an opening therethrough at the location on which the die is to be mounted, and metal (e.g., copper or copper alloy) plate 103a or 103b is laminated to the plastic portion 102 with a downset 104a/104b within and filling the opening and having a bottom surface level with the bottom surface of the plastic portion 102, on which solder balls or lands are to be formed. The integrated circuit die will be mounted on the upper surface of downset 104a/104b, while the bottom surface 201 has a solderable finish and for soldering directly to the PCB. A gap or slot 200 through metal plate 103 exposes bond fingers for later connection with wire bonds.

In the embodiment of FIG. 2A, the downset portion 104a is thinner than the total thickness of substrate 101a (i.e., thinner than the combined thickness of plastic portion 102 and the portion of the plate 103a overlying the plastic portion 102). For example, the substrate 101a may have a total thickness of about 0.45 millimeters (mm), where the plastic portion 102 (which may be multiple layers) has a thickness of about 0.22 mm and a laminate layer (not explicitly shown) between the plastic portion 102 and the heat slug/spreader 103a has a thickness of about 0.1 mm. The metal heat slug/spreader plate 103a has a uniform thickness of about 0.127 mm (stamped and with a total distance of about 0.45 mm between furthest opposing surfaces in the thickness direction).

Figure 3:
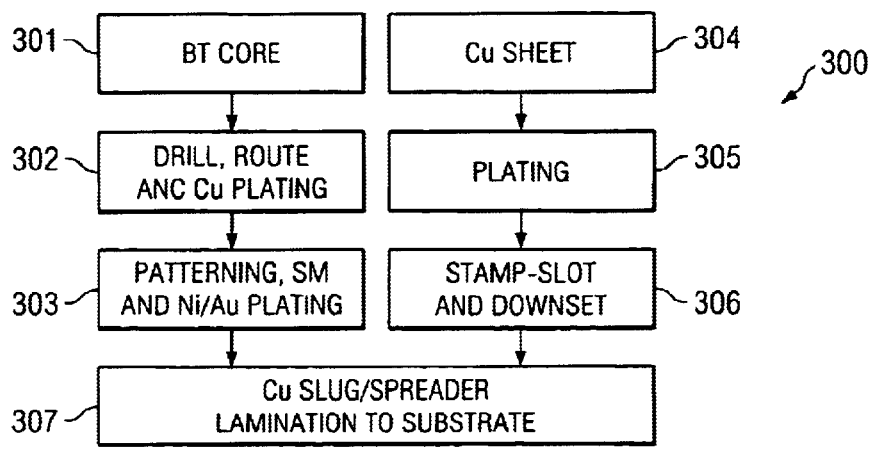
FIG. 3 is a diagram illustrating a process for forming a high thermal conductivity ball grid array or land grid array package utilizing conventional wire bonding and molding toolings for such packages according to one embodiment of the present invention.

FIG. 3 is a diagram illustrating a process for forming a high thermal conductivity ball grid array or land grid array package utilizing conventional molding tooling for such packages according to one embodiment of the present invention. Process 300 begins with parallel formation of the plastic portion of the substrate and the heat slug/spreader. The substrate process starts with a core material (step 301). Via drilling, cavity routing and copper plating are performed (step 302), followed by patterning, solder mask application(s), and plating to selected areas (e.g., bond sites and solder ball or land contact regions) that are required (step 303).

Meanwhile a copper sheet is sized appropriately according to the substrate panel (step 304) and plated to, for example, create a solderable finish on the downset bottom (step 305). The sheet is then stamped to form the slots for exposing the bond sites or fingers and the downset (step 306). Finally, the stamped copper sheet is laminated to the panel of plastic substrate cores (step 307). As a result, heat slug attachment is performed at the panel level at lower unit cost and with higher slug position precision.

Figure 4C:
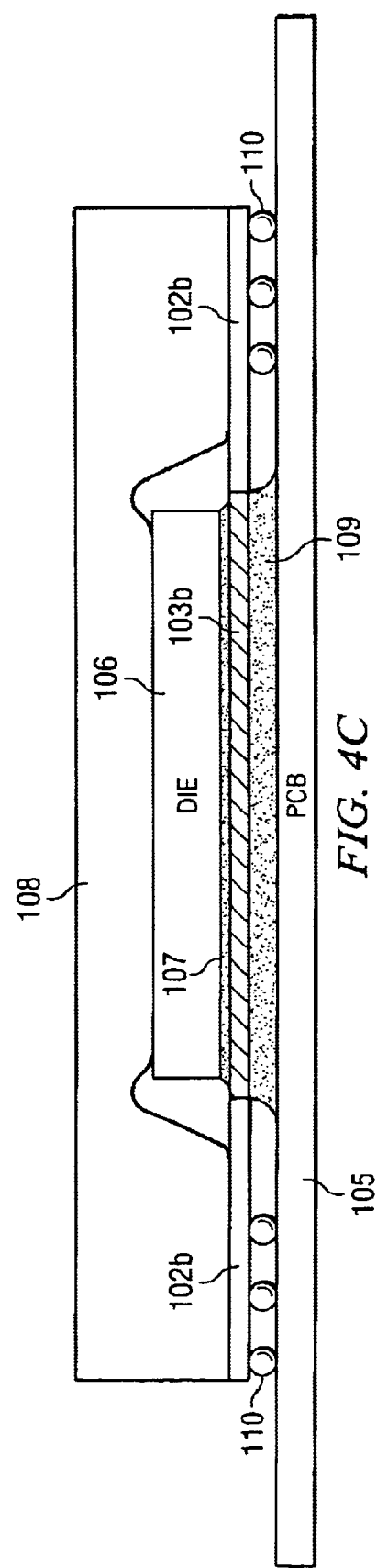
FIGS. 4A through 4C depict various views of a substrate for a high thermal conductivity ball grid array or land grid array package compatible with conventional wire bonding and molding toolings for such packages according to an alternative embodiment of the present invention.
Figure 4A:
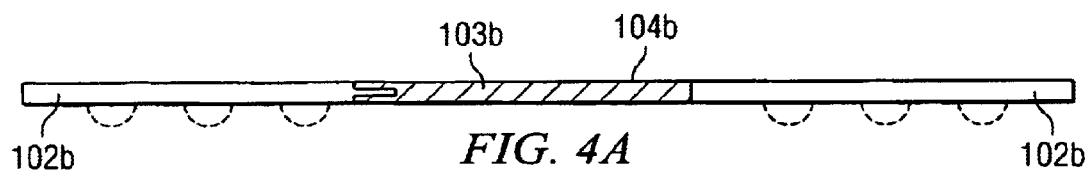
Figure 4B:
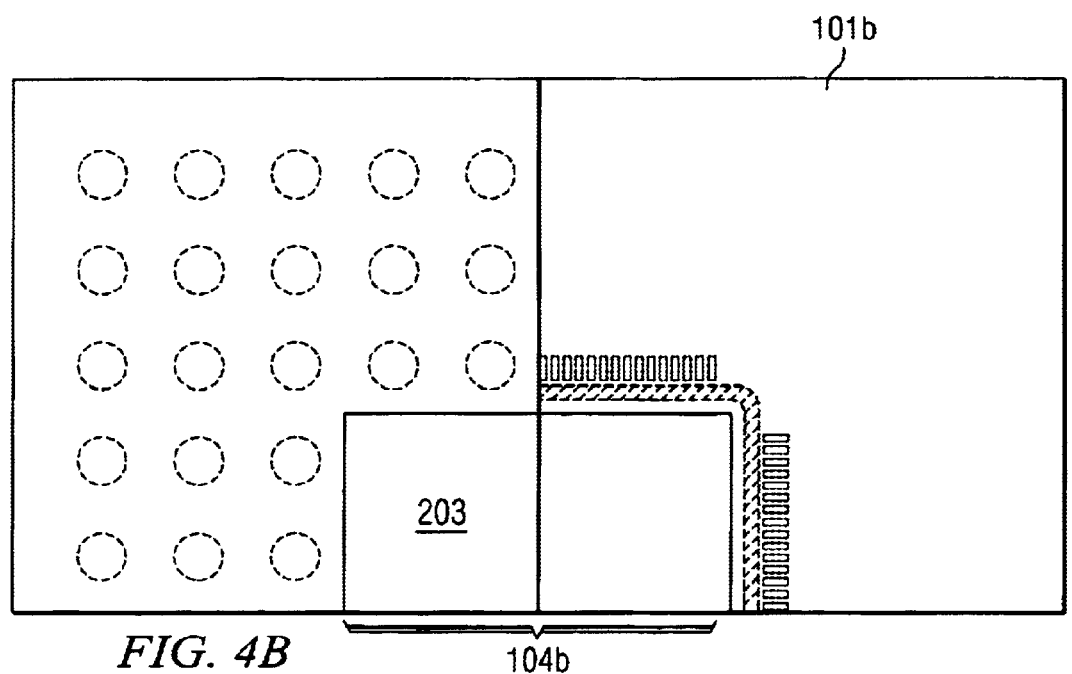

FIGS. 4A through 4C depict various views of another substrate for a high thermal conductivity ball grid array or land grid array package compatible with conventional molding tooling for such packages according to an alternative embodiment of the present invention. In this embodiment, substrate 101b includes a plastic portion 102b with an opening therethrough and metal plate 103b within and filling the opening. Metal plate 103b is illustrated, at the interface with plastic portion 102b on the left side of plate 103b, as slightly overlapping peripheral portions of the plastic portion 102b around the opening. While better interlocking is achieved by such overlap, fabrication of such a structure would be difficult. Accordingly, a simple friction fit as illustrated at the right interface with plastic portion 102b may be utilized, or, alternatively, overlap at the interface on only one major surface (not shown). Normally, both interfaces between plastic portion 102b and metal slug 103b would be fitted similarly.

The bottom surface 203 of heat slug 104b is solderable, and is soldered directly to the PCB during mounting of the packaged integrated circuit. The integrated circuit die is mounted on the opposite surface of the heat slug 104b. While the bottom surface of heat slug 104b is shown as level with the bottom portion, as noted above a slight difference in level may be tolerated provided the two surfaces are substantially aligned.

Bond fingers and an optional ground ring are formed on an upper surface of plastic portion 102b as shown in FIG. 4B. If a ground ring is employed, the ground ring may be electrically connected to the heat slug 103b, which will then serve as a grounding contact.

FIG. 4C shows a packaged integrated circuit utilizing the alternate embodiment of the packaging substrate. Integrated circuit die 106 is attached to the heat slug 103b by an adhesive 107, and encapsulated (together with the bond wires) by an encapsulating material 108. The packaging substrate is then affixed at the heat slug 103b to the PCB 105 by an adhesive 109, with conductive traces on the plastic portion 102b electrically connected to conductive traces on the PCB 105 by solder balls or lands 110.

FIGS. 5A through 5F illustrate stepwise formation of a substrate for a high thermal conductivity ball grid array or land grid array package compatible with conventional molding tooling for such packages according to the alternative embodiment of the present invention. In this process, a substrate core (FIG. 5A) is provided, again typically in the form of a panel including a number of substrates rather than by a single substrate as shown.

The substrate core is first patterned (FIG. 5B) to form the opening in which the heat slug will be inserted and any other specific physical characteristics required (e.g., shelf for the overlap or trenches for signal traces). A metal heat slug is then inserted in the opening (FIG. 5C), and swaged (FIG. 5D), with the slug held in place by contact pressure with the sides of the opening through the plastic substrate portion. As noted earlier, a ground ring electrically connected to the heat slub may be formed on the substrate through plating and patterning.

A dry film process is then used to pattern materials on an upper surface of the substrate, and a solder mask is employed to form the balls or lands on the bottom (FIG. 5E). After nickel and/or silver plating, the dry film is stripped off (FIG. 5F).

The present invention provides good heat slug placement precision, and may be employed with standard transfer molding tools. Use of land grid array contacts is also enabled, reducing solder costs.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A substrate for a ball or land grid array package comprising:

an insulative layer having an opening therethrough at a region on which an integrated circuit die is to be mounted on the substrate, a bottom surface of the insulative layer adapted for bearing a plurality of contact regions; and a thermally conductive material within the opening and having a bottom surface which is solderable and substantially level with the bottom surface of the insulative layer, an upper surface of the thermally conductive material adapted for receiving the integrated circuit die thereon.

2. The substrate according to claim 1, wherein the thermally conductive material extends over an upper surface of the insulative layer.

3. The substrate according to claim 2, wherein the thermally conductive material includes a groove exposing bond fingers on the upper surface of the insulative layer.

4. The substrate according to claim 1, wherein the upper surface of the thermally conductive material is below an upper surface of the substrate.

5. The substrate according to claim 1, wherein the thermally conductive material fills the opening through the insulative layer.

6. The substrate according to claim 1, wherein the thermally conductive material is a copper or copper alloy metal.

7. The substrate according to claim 1, wherein the thermally conductive material is a stamped copper or copper alloy metal sheet having a down set sized to correspond in depth to the opening through the insulative layer, the down set having a solderable bottom surface and adapted to receive the integrated circuit die on an upper surface thereof.

8. A ball or land grid array integrated circuit package comprising:

a substrate including:

an insulative layer having an opening therethrough at a region on which an integrated circuit die is to be mounted on the substrate, a bottom surface of the insulative layer adapted for bearing a plurality of contact regions; and a thermally conductive material within the opening and having a bottom surface which is solderable and substantially level with the bottom surface of the insulative layer, an upper surface of the thermally conductive material adapted for receiving the integrated circuit die thereon;

an integrated circuit die mounted over the upper surface of the thermally conductive material; bond wires connected to the integrated circuit die; and an encapsulating material over the integrated circuit die and bond wires and over an upper surface of the thermally conductive material and at least a portion of the insulative layer.

9. The integrated circuit package according to claim 8, wherein the thermally conductive material extends over an upper surface of the insulative layer.

10. The integrated circuit package according to claim 9, wherein the thermally conductive material includes a groove exposing bond fingers on the upper surface of the insulative layer.

11. The integrated circuit package according to claim 8, wherein the upper surface of the thermally conductive material is below an upper surface of the substrate.

12. The integrated circuit package according to claim 8, wherein the thermally conductive material fills the opening through the insulative layer.

13. The integrated circuit package according to claim 8, wherein the thermally conductive material is a copper or copper alloy metal.

14. The integrated circuit package according to claim 8, wherein the thermally conductive material is a stamped copper or copper alloy metal sheet having a down set sized to correspond in depth to the opening through the insulative layer, the down set having a solderable bottom surface and adapted to receive the integrated circuit die on an upper surface thereof.

15. A method of forming a substrate for a ball or land grid array package comprising:

forming an opening through an insulative layer at a region on which an integrated circuit die is to be mounted on the substrate, a bottom surface of the insulative layer adapted for bearing a plurality of contact regions; and inserting a thermally conductive material within the opening, the thermally conductive material having a bottom surface which is solderable and substantially level with the bottom surface of the insulative layer, an upper surface of the thermally conductive material adapted for receiving the integrated circuit die thereon.

16. The method according to claim 15, further comprising:

forming the thermally conductive material extending over an upper surface of the insulative layer.

17. The method according to claim 15, further comprising:

forming a groove within the thermally conductive material exposing bond fingers on the upper surface of the insulative layer.

18. The method according to claim 15, further comprising:

forming the thermally conductive material with the upper surface below an upper surface of the substrate.

19. The method according to claim 15, further comprising:

filling the opening through the insulative layer with the thermally conductive material.

20. The method according to claim 15, further comprising:

forming the thermally conductive material from a stamped copper or copper alloy metal sheet having a down set sized in depth to correspond to the opening through the insulative layer, the down set having a solderable bottom surface and adapted to receive the integrated circuit die on an upper surface thereof.

* * * * *